United States Patent
Ishii et al.

(10) Patent No.: US 11,293,978 B2
(45) Date of Patent: Apr. 5, 2022

(54) VOLTAGE APPLICATION DEVICE FOR TESTING PLURALITY OF DEVICES AND METHOD OF FORMING OUTPUT VOLTAGE WAVEFORM

(71) Applicant: Tokyo Electron Limited, Tokyo (JP)

(72) Inventors: Shigeki Ishii, Yamanashi (JP);
Katsuaki Sugiyama, Yamanashi (JP);
Kenichi Narikawa, Yamanashi (JP);
Koji Shinagawa, Yamanashi (JP);
Takumi Nagura, Yamanashi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 141 days.

(21) Appl. No.: 16/645,609

(22) PCT Filed: Jul. 25, 2018

(86) PCT No.: PCT/JP2018/027949
§ 371 (c)(1),
(2) Date: Mar. 9, 2020

(87) PCT Pub. No.: WO2019/054059
PCT Pub. Date: Mar. 21, 2019

(65) Prior Publication Data
US 2020/0278392 A1 Sep. 3, 2020

(30) Foreign Application Priority Data
Sep. 12, 2017 (JP) .............................. JP2017-174700

(51) Int. Cl.
*G01R 31/317* (2006.01)
(52) U.S. Cl.
CPC .............................. *G01R 31/31721* (2013.01)

(58) Field of Classification Search
CPC .......... G01R 31/3004; G01R 31/31721; G01R 31/31924; H02M 3/156; H02M 3/158;
(Continued)

(56) References Cited

U.S. PATENT DOCUMENTS 4,308,491 A * 12/1981 Joyner, Jr. ............ H02H 7/0833
318/732
6,775,160 B2 * 8/2004 Siri ...................... H02M 1/4208
363/89
(Continued)

FOREIGN PATENT DOCUMENTS

JP 03-017581 U 2/1991

OTHER PUBLICATIONS

International Search Report dated Oct. 23, 2018 for WO 2019/054059 A1.

*Primary Examiner* — Vinh P Nguyen
(74) *Attorney, Agent, or Firm* — Abelman, Frayne & Schwab

(57) ABSTRACT

A voltage application device of a tester includes a voltage setting controller that sets a number of transient steps, step time, and step voltage as transient voltage setting parameters; and a device power supply (DPS) configured to supply power to the plurality of devices under test formed on a substrate. The voltage application device outputs an output voltage having a step-like transient voltage waveform based on the transient voltage setting parameters set by the voltage setting controller. The voltage application device is a high-order lag system of a second-order or higher in which an overshoot occurs in a response with respect to a set voltage. An end point of a step time of each of the transient steps set in the voltage setting controller is set to be a time between an end point of a rising time and an overshoot time.

10 Claims, 7 Drawing Sheets

(58) Field of Classification Search
CPC ........ H02M 3/10; H02M 3/145; H02M 3/155; H02M 3/1588; H02M 3/157; Y02B 70/10
See application file for complete search history.

(56) References Cited

U.S. PATENT DOCUMENTS 6,983,039 B2 * 1/2006 Ishikawa ................. H04L 47/11
379/112.01
10,082,536 B2 * 9/2018 Na ..................... G01R 31/2875

* cited by examiner

VOLTAGE APPLICATION DEVICE FOR TESTING PLURALITY OF DEVICES AND METHOD OF FORMING OUTPUT VOLTAGE WAVEFORM

CROSS REFERENCE TO RELATED APPLICATIONS

This application is a national phase of PCT application No. PCT/JP2018/027949, filed on 25 Jul. 2018, which claims priority from Japanese patent application No. 2017-174700, filed on 12 Sep. 2017, all of which are incorporated herein by reference.

TECHNICAL FIELD

The present disclosure relates to a voltage application device that applies a voltage to a device and a method of forming an output voltage waveform, which are used in a tester that performs an electrical inspection of the device.

BACKGROUND

In a semiconductor device manufacturing process, when all processes on a semiconductor wafer (hereinafter, simply referred to as a wafer) are completed, various electrical tests are performed on a plurality of devices under test (DUT) formed on the wafer.

An inspection of the electrical characteristics of the DUT, which is the device to be inspected, is performed by a tester via a probe card. The probe card is provided with a plurality of probes (contacts) that is in contact with the electrode pads of the DUT on the wafer. The DUT on the wafer is inspected by sending an electrical signal from the tester to each probe while each probe is in contact with each electrode pad on the wafer.

The tester has a device power supply (DPS) which is a voltage application device for applying a predetermined voltage to the DUT, and a predetermined voltage is applied from the DPS to the DUT. The rising waveform (transient voltage) of the output voltage of the DPS is determined by the circuit characteristics of the DPS and the load connected to the device power supply line. Specifically, there are a configuration in which a large-capacity load is connected to a device power supply line from the DPS to the DUT, and a configuration in which a large-capacity load is not connected. When a phase compensation circuit composed of passive elements of the DPS is optimized for a configuration in which a large-capacity load is connected, the rising waveform of the output voltage of the DPS deteriorates when no large-capacity load is connected, and, for example, an overshoot occurs.

As such, there is a problem that when the rising waveform of the output voltage deteriorates, the DUT malfunctions because the output voltage does not monotonically increase, or stress is applied to the DUT when an excessive overshoot occurs in the rising waveform.

As a technique to cope with such a problem, Patent Document 1 proposes applying a voltage in a stepwise manner when applying a voltage from a power supply of a tester to a semiconductor element on a semiconductor wafer.

PRIOR ART DOCUMENT

Patent Document

Patent Document 1: Japanese Utility Model Laid-Open Publication No. 03-017581 (Microfilm of Japanese Utility Model Application No. 01-078138)

SUMMARY OF THE INVENTION

Problems to be Solved

The present disclosure provides a technique capable of suppressing deterioration of a rising waveform of an output voltage applied to a DUT without changing a circuit and achieving a set voltage value in a short time.

Means to Solve the Problems

A voltage application device according to an embodiment of an aspect of the present disclosure applies a voltage to a plurality of devices under test in a tester that tests electrical characteristics of the plurality of devices under test formed on a substrate. The voltage application device includes a voltage setting unit that sets the number of transient steps, step time, and step voltage as transient voltage setting parameters such that when a predetermined setting condition including a set voltage value is given, a step-like transient voltage waveform having a plurality of transient steps adapted to the predetermined setting condition is formed. The voltage application device outputs an output voltage having the step-like transient voltage waveform based on the transient voltage setting parameters set by the voltage setting unit. The voltage application device is a high-order lag system of a second-order or higher in which an overshoot occurs in a response obtained when the output voltage output from the device power supply is step-input to the devices under test connected to the voltage application device with respect to a set voltage, and an end point of the step time of each of the transient steps set in the voltage setting unit is set to be a time between the end point of the rising time and the overshoot time in a step response curve of the high-order lag system.

Effect of the Invention

According to the present disclosure, it is possible to suppress the deterioration of the rising waveform of the output voltage applied to the DUT and to reach the set voltage value in a short time without changing the circuit.

DETAILED DESCRIPTION TO EXECUTE THE INVENTION

Hereinafter, various embodiments of the present disclosure will be described in detail with reference to the drawings.

<Inspection Apparatus>

Figure 1:
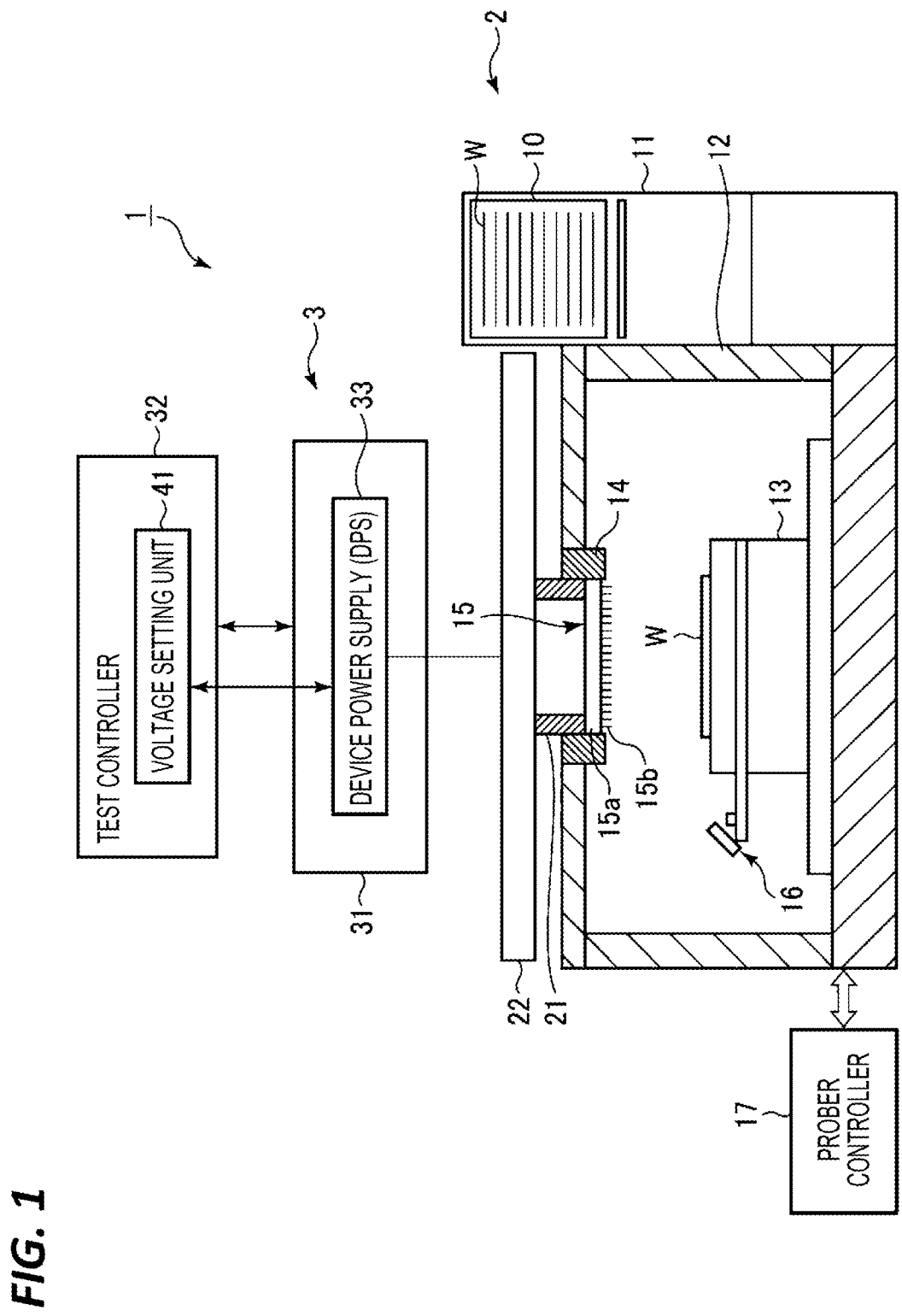
FIG. 1 is a cross-sectional view illustrating a schematic configuration of an example of an inspection apparatus using a device power supply according to an embodiment of the present disclosure.

FIG. 1 is a cross-sectional view illustrating a schematic configuration of an example of an inspection apparatus using a device power supply according to an embodiment.

In FIG. 1, an inspection apparatus 1 includes a prober 2 and a tester 3. The prober 2 brings a probe for transmitting and receiving an inspection signal into contact with a plurality of DUTs formed on a wafer W. Further, the tester 3 sends an electric signal to each DUT on the wafer W, receives a response signal from the DUT, and inspects the electrical characteristics of the DUT on the wafer W.

The prober 2 includes a loader unit 11, an inspection room 12, a mounting table 13, a holder 14, a probe card 15, an alignment mechanism 16, and a prober controller 17. The loader unit 11 has a transfer device (not illustrated) on which a FOUP 10, which is a container for storing a plurality of wafers W, is mounted, and which transfers the wafers W. In the inspection room 12, an inspection of the wafers W is performed. The mounting table 13 has a drive unit (not illustrated) in which the wafers W are mounted in the inspection room 12 and which moves the wafers W in the X, Y, Z, and θ directions. The holder 14 is arranged above the mounting table 13 and supports the probe card 15. The probe card 15 has a support substrate 15a and a plurality of probes (contacts) 15b. The probe card 15 is connected to the tester 3 via a connection ring 21 having multiple connection terminals and an interposer (performance board) 22 via pogo pins. The alignment mechanism 16 aligns the plurality of probes 15b with the electrode pads (not illustrated) of the plurality of DUTs formed on the wafer W. The prober controller 17 controls the respective components of the prober 2.

The tester 3 has a tester main body 31 and a tester controller 32. The tester main body 31 has a device power supply (DPS) 33 which is a voltage application device for applying a voltage to the DUT on the wafer W, and a component (not illustrated) such as a circuit and a capacitor necessary for testing the DUT.

Figure 2:
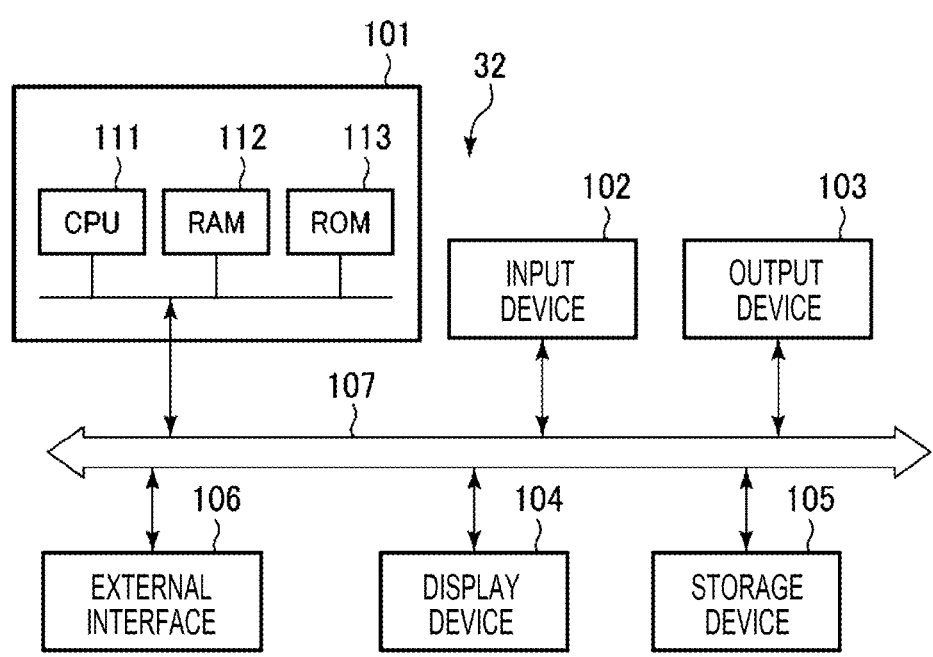
FIG. 2 is a cross-sectional view illustrating a hardware configuration of a controller in the inspection apparatus of FIG. 1.

The tester controller 32 controls the respective components of the tester 3. The present embodiment is particularly characterized by the control of the DPS 33, and includes a voltage setting unit 41 that functions as a part of the DPS 33. The tester controller 32 is typically a computer. FIG. 2 illustrates an example of a hardware configuration of the tester controller 32 illustrated in FIG. 1. The tester controller 32 includes a main controller 101, an input device 102 such as a keyboard or a mouse, an output device 103 such as a printer, a display device 104, a storage device 105, an external interface 106, and a bus 107 which connect these components to each other. The main controller 101 has a central processing unit (CPU) 111, a random access memory (RAM) 112, and a read only memory (ROM) 113. The storage device 105 is configured to record and read information on a computer-readable storage medium. Examples of the storage medium include a hard disk, an optical disk, and a semiconductor memory such as a flash memory. The storage medium stores recipes and the like for performing the inspection method according to the present embodiment, and also functions as a database for setting an applied voltage to the DUT set in a voltage setting unit of the DPS 33 (to be described later).

<Device Power Supply>

Figure 3:
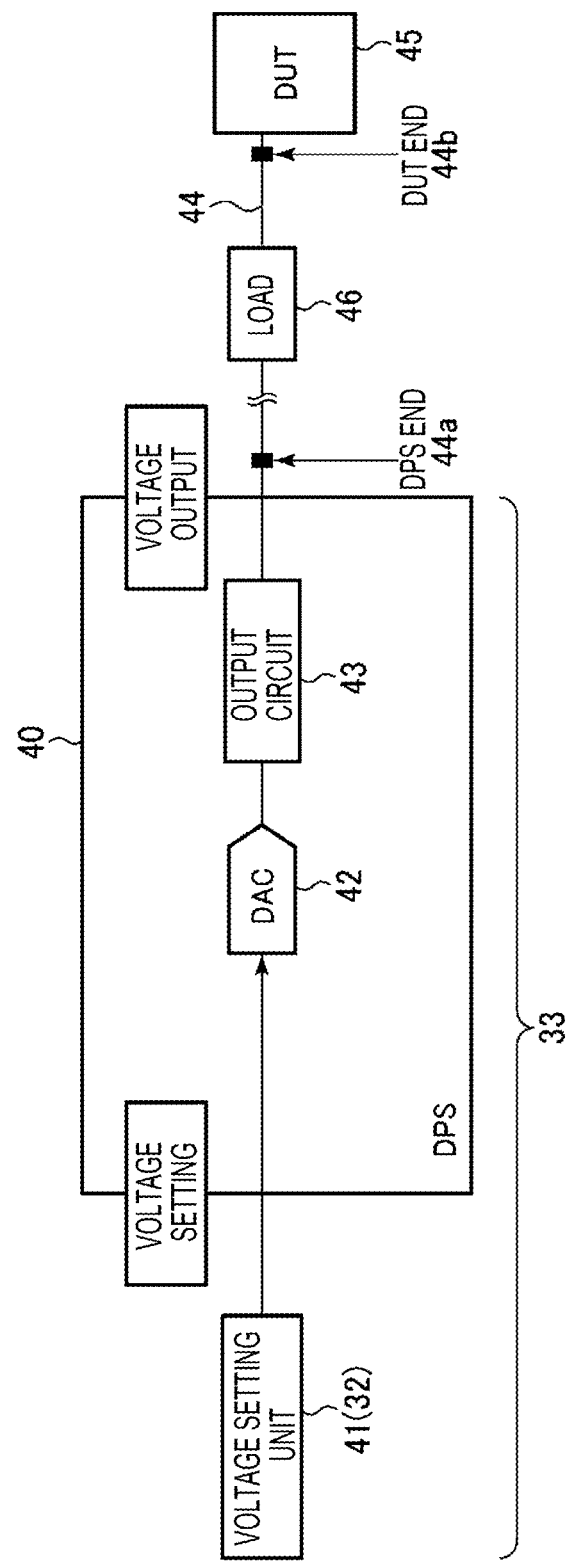
FIG. 3 is a block diagram illustrating a device power supply according to an embodiment of the present disclosure.

Next, descriptions will be made on the device power supply 33 which is a voltage application device. FIG. 3 is a block diagram illustrating the device power supply according to an embodiment of the present disclosure.

As illustrated in FIG. 3, the DPS 33 includes a DPS main body 40 and a voltage setting unit 41 that forms a part of the tester controller 32. The DPS main body 40 has a digital-to-analog converter (DAC) 42 and an output circuit 43. A set voltage signal (digital signal) is input from the voltage setting unit 41, converted into an analog signal by the DAC 42, and a predetermined output voltage is output via the output circuit 43. The output voltage is applied to the DUT 45 via a feed line 44. The DPS 33 side of the feed line 44 is a DPS end 44a, and the DUT 45 side thereof is a DUT end 44b. A load 46 is provided on the DUT end 44b side of the feed line 44. The value of the load 46 varies depending on the type of inspection, and may be zero.

The voltage setting unit 41 sets a parameter for forming a rising waveform of the output voltage (transient voltage waveform) at the DPS end so that the voltage at the DUT end applied to the DUT 45 is appropriate without overshoot or the like. Specifically, the database in the storage medium of the storage device 105 stores conditions including a set voltage value (steady value), for example, a plurality of transient voltage setting parameters for setting the rising waveform of the output voltage (transient voltage waveform) corresponding to the circuit characteristics of the output circuit 43, the value of the load 46 at the DUT end, in addition to the set voltage value. When a condition including a set voltage value (steady value) is given, a suitable transient voltage setting parameter is obtained from the database, and the rising waveform of the output voltage (transient voltage waveform) is set as described later.

<Method of Forming Output Voltage Waveform>

Next, a method of forming an output voltage waveform will be described. Here, the voltage setting unit 41 sets the rising waveform of the output voltage (transient voltage waveform) and forms an output voltage waveform so that the rising waveform (transient voltage waveform) at the DUT end does not overshoot. Specifically, the voltage setting unit 41 sets the voltage so that the rising waveform of the output voltage (transient voltage waveform) has a step shape.

Figure 4:
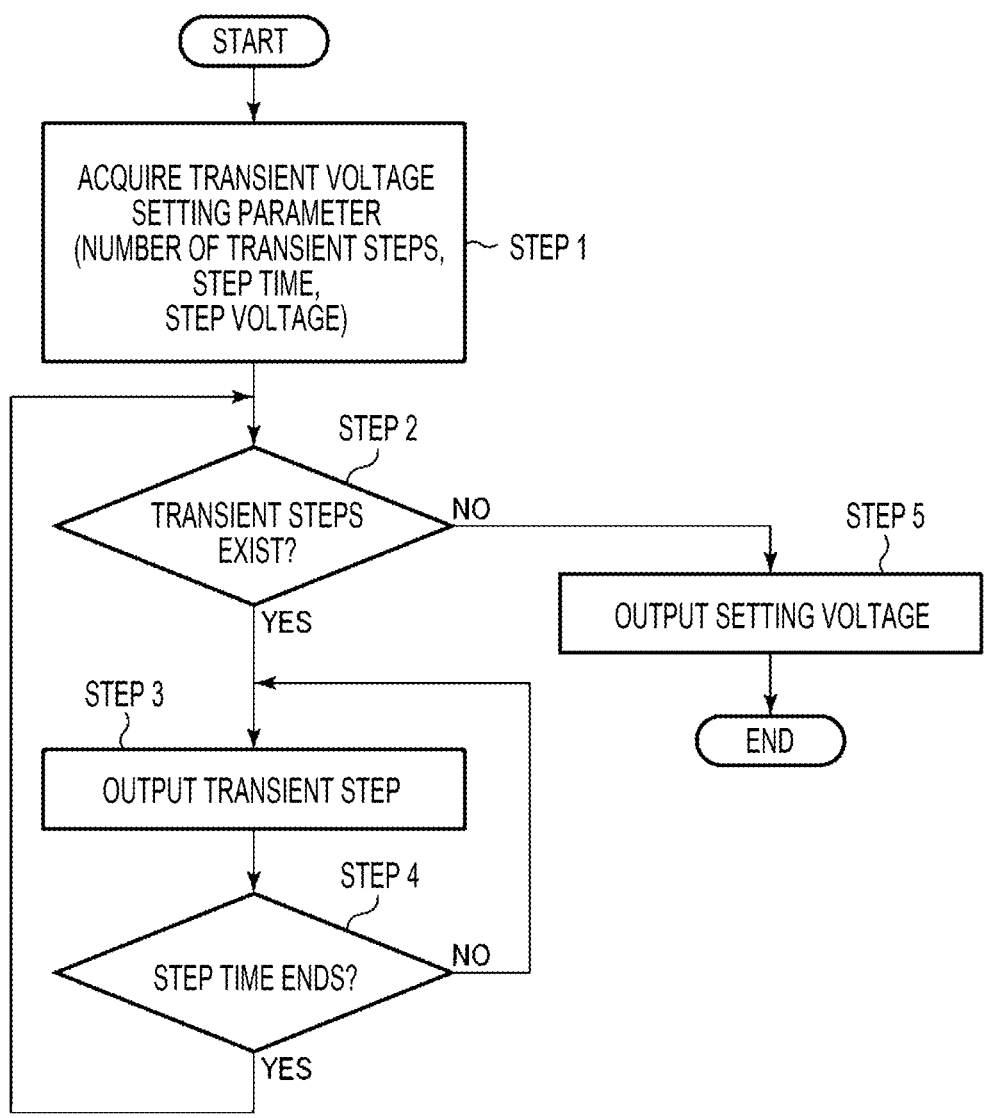
FIG. 4 is a flowchart illustrating a method of forming a rising waveform of an output voltage.

FIG. 4 is a flowchart illustrating a method of forming a rising waveform of an output voltage. First, when a condition including a value of a set voltage value (steady value) is given, a transient voltage setting parameter of a rising waveform of an input voltage (transient voltage waveform) is obtained from the database in a storage medium of the storage device 105 according to the condition (step 1).

In the present embodiment, since the rising waveform of the output voltage (transient voltage waveform) is set in a step-like manner, the number of transient steps, step time, and step voltage are used as the transient voltage setting parameters. The database stores conditions including a set voltage value (steady value), for example, a plurality of pieces of data on the number of transient steps, the step time, and step voltage corresponding to the circuit characteristics of the output circuit 43, the value of the load 46 at the DUT end, in addition to the set voltage value. The number of transient steps refers to the number of steps in the step-like transient voltage waveform, the step time refers to the time of one step in the transient voltage waveform, and the step voltage refers to the rising voltage in one step of the transient voltage waveform. At this time, when a condition including a set voltage value (steady value) is given, the number of transient steps, step time, and step voltage are obtained and set according to the condition.

Next, it is determined whether there is a transient step to be set (step 2). When it is determined that there is a transient step to be set, a transient voltage is set (output) (step 3). Whether the step time ends is determined (step 4). When the step time ends, the process returns to step 2, and when there is a transient step, the transient voltage is set (output) in step 3 for the next transient step. This is repeated, and when there is no more transient step to be set next, a rising waveform of the set voltage, that is, the output voltage (transient voltage waveform) is output (step 5).

Figure 5:
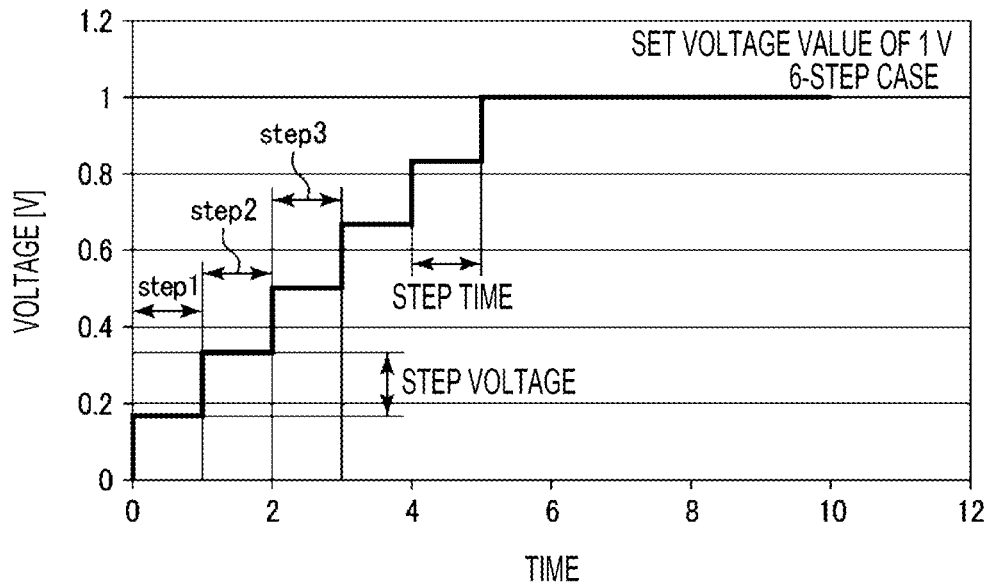
FIG. 5 is a diagram schematically illustrating an example of a transient voltage waveform of the output voltage formed by the method of forming the rising waveform of the output voltage in FIG. 4.

FIG. 5 represents an example of the transient voltage waveform of the output voltage actually set at this time. This example is an example in which the set voltage value is 1 V and the number of transient steps is 6. FIG. 5 represents an example in which the step time and the step voltage are equal for convenience, but these values are optimized according to conditions.

<Parameter Setting Method>

Next, a method of setting the number of transient steps, step time, and step voltage, which are voltage setting parameters, will be described.

It is considered that the DUT connected to the tester is an RLC circuit in consideration of a parasitic capacitor and a parasitic inductance, and a response to a step input is, for example, a second-order lag system, and an overshoot occurs.

Figure 6:
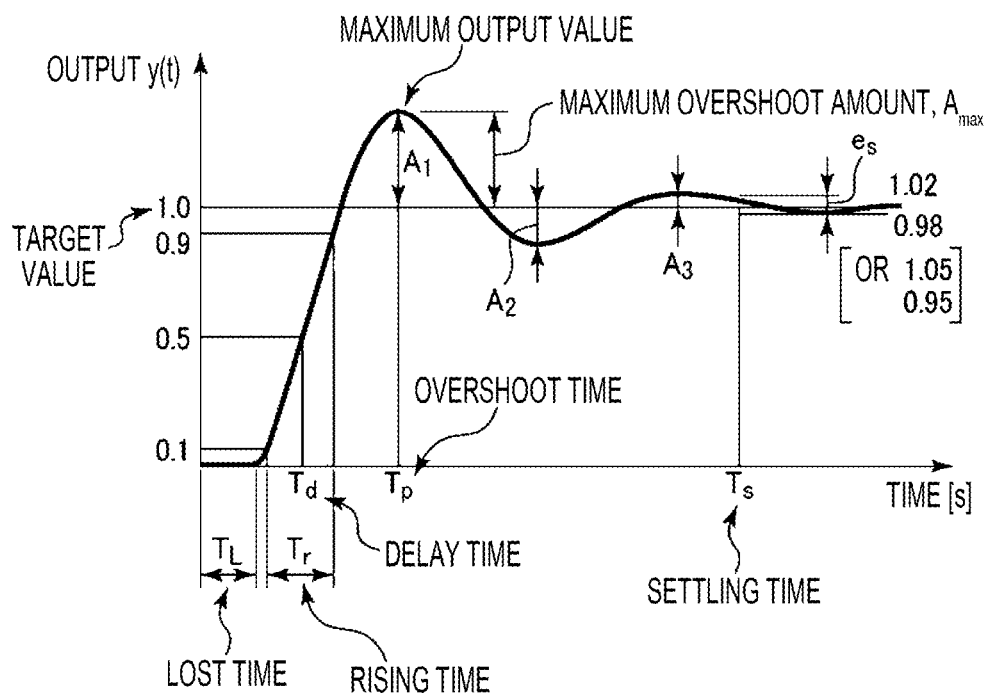
FIG. 6 is a diagram illustrating a curve of a step response output of a general second-order lag system.

It is known that a curve of the step response output of the second-order lag system is generally as illustrated in FIG. 6. In FIG. 6, the term "$A_{max}$" refers to the maximum overshoot, that is, the value at which a difference between the output value and the target value is maximized. The term "$T_p$" refers to the overshoot time, which is the time to the maximum overshoot. The term "$T_r$" refers to a rising time which is a time required for the output value to reach 90% from 10% of the target value. The term "$T_d$" refers to a delay time that is a time required for the output value to reach 50% of the target value. The term "$T_s$" refers to a settling time that is a time from a target value to a certain error range, and the term "$T_L$" refers to a lost time.

Further, the equation of the step response of the second-order lag system is expressed by the following equation (1).

$$y(t) = \mathcal{L}^{-1}\left[\frac{\omega_n^2}{s(s^2 + 2\zeta\omega_n s + \omega_n^2)}\right] = \quad \text{[Equation 1]}$$

$$1 - \frac{e^{-\zeta\omega_n t}}{\sqrt{1-\zeta^2}}\sin\left(\omega_n\sqrt{1-\zeta^2}\,t + \tan^{-1}\frac{\sqrt{1-\zeta^2}}{\zeta}\right)$$

Here, t: time, $\omega_n$: natural angular frequency, $\xi$: attenuation coefficient, and $0<\xi<1$.

When a transient voltage is applied stepwise as in the present embodiment, it is necessary to raise the voltage to a set voltage value (steady value) quickly without overshoot occurring at each step. For this purpose, it has been found that it is effective to switch to the next set output between the end point of the rising time $T_r$ and the overshoot point $T_p$ in the curve of FIG. 6 obtained corresponding to the voltage value in each transition step. Therefore, in the present embodiment, the above-mentioned end point of the step time of each transient step is set to be a time between the end point of the rising time $T_r$ and the overshoot point $T_p$ in the curve of the step response of the second-order lag system corresponding to the step voltage of each transient step.

At this time, it is preferable that the step voltage of the transient step decreases as the transient step proceeds. That is, when the set voltage of the transient step t is $V_t$, the set voltage of the preceding transient step t−1 is $V_{t−1}$, and the set voltage of the subsequent transient step t+1 is $V_{t+1}$, it is preferable that $V_t − V_{t−1} > V_{t+1} − V_t$. At this time, the step voltage of the transition step t is $V_t − V_{t−1}$, and the step voltage of the transition step t+1 is $V_{t+1} − V_t$. By doing so, an overshoot may be made more difficult to occur.

Figure 7:
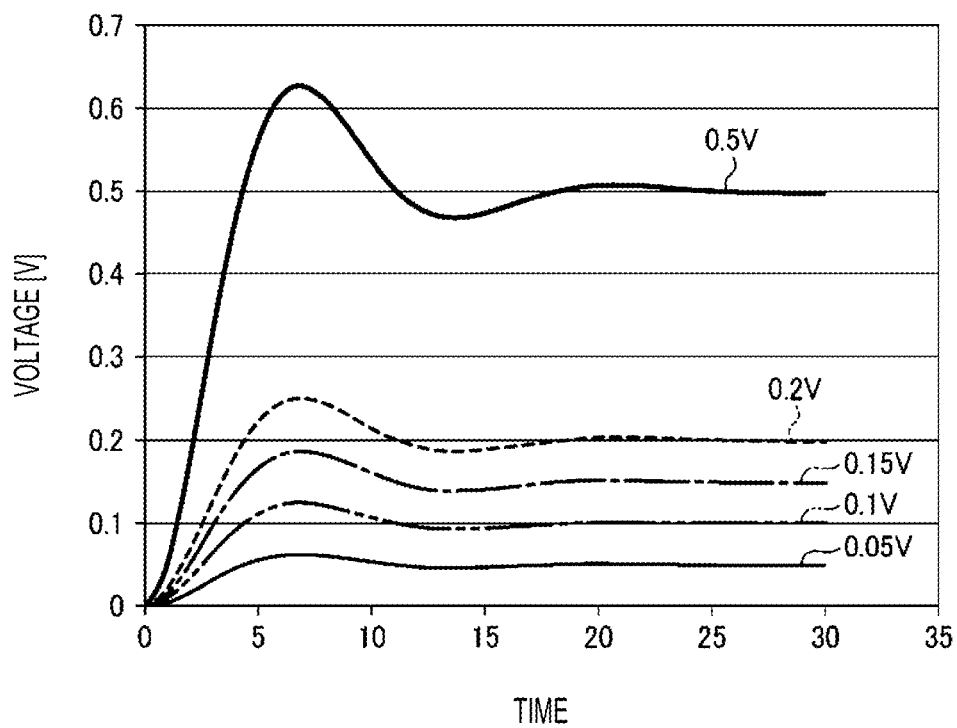
FIG. 7 is a diagram illustrating a step response of a second-order lag system when voltages of 0.5 V, 0.2 V, 0.15 V, 0.1 V, and 0.05 V, respectively, are output.
Figure 8:
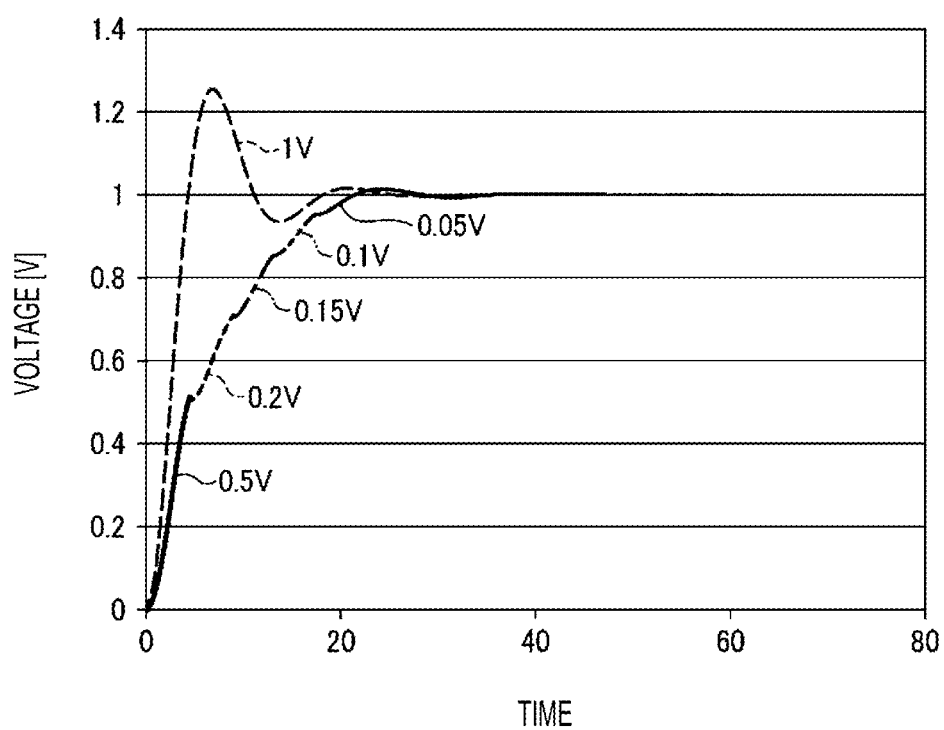
FIG. 8 is a diagram illustrating a step response of a second-order lag system when a voltage of 1 V is output and when a step-like transient voltage waveform is output to have a step voltage that is changed from 0.5 V to 0.2 V to 0.15 V to 0.1 V to 0.05 V.

For example, according to the above equation (1), the step response of the second-order lag system when voltages of 0.5 V, 0.2 V, 0.15 V, 0.1 V, and 0.05 V, respectively, are output is as illustrated in FIG. 7. FIG. 8 is a diagram illustrating a step response of a second-order lag system when a voltage of 1 V is output and when a step-like transient voltage waveform is output to have a step voltage that is changed from 0.5 V to 0.2 V to 0.15 V to 0.1 V to 0.05 V. In the step-like transient voltage waveform, the end point of the step time at each step is set to be a time between the end point of the rising time $T_r$ and the overshoot point $T_p$, and is superimposed and output so that the total becomes 1 V. As illustrated in FIG. 8, it may be seen that when a voltage of 1 V is output, a large overshoot occurs in the step response of the second-order lag system, whereas when the step-like transient voltage waveform is superimposed as described above, an overshoot may be removed in the step response of the second-order lag system. In addition, in the time corresponding to the time between the end point of the rising time $T_r$ and the overshoot point $T_p$, theoretically, an overshoot may occur in each step. However, in actuality, there is a response delay when the voltages are superimposed, and almost no overshoot occurs.

As described above, in the present embodiment, a plurality of pieces of data on the number of transient steps, the step time, and the step voltage is stored as the transient voltage setting parameters corresponding to the plurality of setting conditions including the set voltage value. Then, in the DPS 33 of the tester 3, the voltage setting unit 41 acquires the number of transient steps, the step time, and the step voltage from the database according to given predetermined setting conditions, and forms an output voltage in a step-like manner. At this time, it is considered that the DUT connected to the tester is an RLC circuit in consideration of a parasitic capacitor and a parasitic inductance, and a response to a step input is, for example, a second-order lag system. For this reason, the end point of the step time in each transient step is set to be a time corresponding to a time between the end point of the rising time $T_r$ and the overshoot point $T_p$ in the step response curve of the second-order lag system. As a result, the rising waveform of the voltage output from the DPS 33 and applied to the DUT end 44b may be made substantially free from overshoot or the like without changing the output circuit 43 of the DPS 33. In addition, the step time may be shortened, and the set voltage value may be reached in a short time.

Patent Document 1 proposes a technique in which a voltage is applied in a step-like manner when a voltage is applied from a power supply of a tester to a DUT formed on a wafer. However, in the technique of Patent Document 1, a voltage is simply applied in in a step-like manner and a time management is not performed. For this reason, an overshoot may occur at each stage, and it is difficult to reliably eliminate the adverse effect on the DUT. Also, in order to prevent an overshoot in each stage, it is necessary to reduce the voltage rise per stage and increase the number of times, but in this case, it takes a very long time until the steady voltage is reached. In this regard, according to the present embodiment, it is possible to suppress the deterioration of the rising waveform of the output voltage applied to the DUT and to reach the set voltage value in a short time without changing the circuit.

Figure 9:
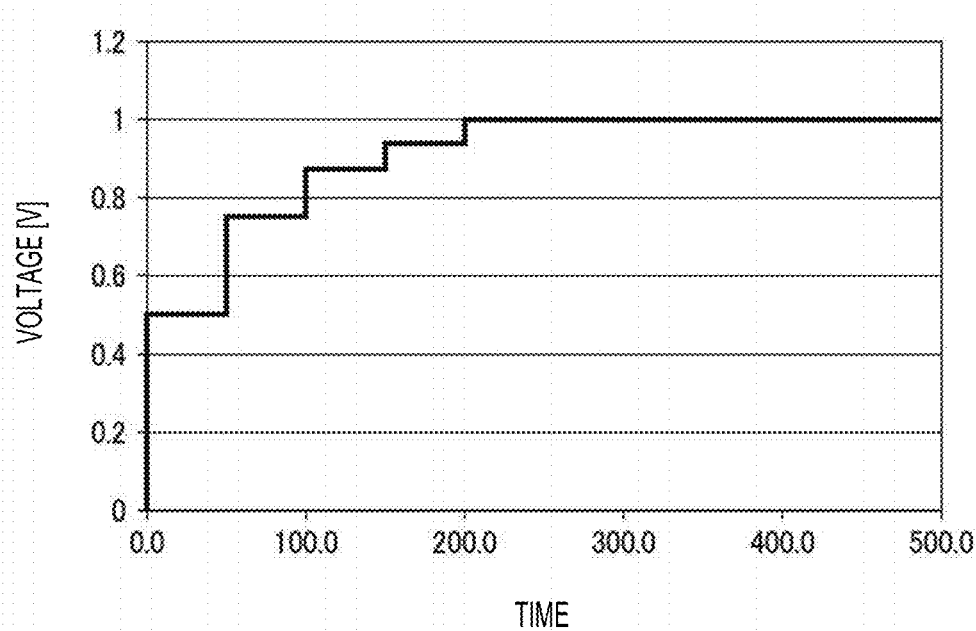
FIG. 9 is a diagram illustrating the transient voltage waveform output by setting the transient voltage waveform actually output from a DPS to five steps in which the step voltage is changed from 0.5 V to 0.2 V to 0.15 V to 0.1 V to 0.05 V, and the step time of each step to a time corresponding to a time between the end point of a rising time Tr and the overshoot point Tp in the condition that a voltage of 1 V is output from the DPS and a large overshoot occurs at the DUT end.
Figure 10:
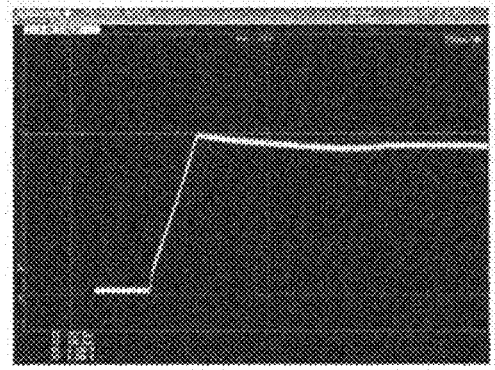
FIG. 10 is a photograph illustrating a response waveform at an actual DUT end when the transient voltage waveform of FIG. 9 is output.

Under the condition that a voltage of 1 V is output from the DPS and a large overshoot occurs at the DUT end, as actually illustrated in FIG. 9, the transient voltage waveform output from the DPS 33 is set to five steps in which the step voltage is changed from 0.5 V to 0.2 V to 0.15 V to 0.1 V to 0.05 V. Then, the step time of each step is set and output to be a time corresponding to the time between the end point of the rising time $T_r$ and the overshoot point $T_p$. As a result, it has been confirmed that the response waveform at the DUT end is set such that the output response is superimposed to form a slope as illustrated in FIG. 10, and no overshoot occurs.

In the related art, since the performance at the end of a pogo pin connected to a probe card (pogo end) is specified in a tester, when a load is connected to the DUT end, it is necessary to evaluate whether an expected power supply waveform may be obtained. As a result of the evaluation, when an overshoot or the like occurs, it is necessary to take measures such as forming a compensation circuit in the probe card. However, in the present embodiment, not only does the DPS circuit need not be changed, but there is no need to use such a compensation circuit, and it takes no time to evaluate whether an expected power supply waveform may be obtained. Thus, an overshoot may be easily suppressed. For this reason, the technique of the present embodiment is useful.

<Other Applications>

Although the embodiments have been described above, the embodiments disclosed this time need to be considered as illustrative in all points and not restrictive. The embodiments described above may be omitted, substituted, or changed in various forms without departing from the scope of the appended claims and the subject matter thereof.

For example, in the above embodiment, the step voltage is gradually decreased with the progress of the step, but the present disclosure is not limited to this. A case where the voltage is constant, a case where the increment of the voltage in the subsequent step increases, a case where the increase and decrease are mixed, and the like may be used.

Further, in the above embodiment, descriptions have been made on a case where the overshoot of the second-order lag system of the voltage at the DUT end is suppressed, but the present disclosure is not limited to this. The present disclosure may be applied to any high-order lag system in which a voltage overshoot occurs and may also be applied to other rising waveform failures such as a case where the voltage at the DUT end does not monotonically increase.

Further, in the above-described embodiment, descriptions have been made on the case of the DPS as the voltage application device used in the tester that applies a voltage to the device, but the present disclosure is not limited to this. The present disclosure may also be applied to other voltage application devices such as a parametric measurement unit (PMU) of a tester component used when applying a voltage to the DUT and various drivers.

DESCRIPTION OF SYMBOLS

1: inspection apparatus
2: prober
3: tester
31: tester main body
32: test controller
33: device power supply (DPS)
40: DPS main body
41: voltage setting unit
45: DUT
46: load
W: wafer

What is claimed is:

1. A voltage application device of a tester that tests electrical characteristics of a plurality of devices under test formed on a substrate, the voltage application device comprising:

a voltage setting controller that sets a number of transient steps, step time, and step voltage as transient voltage setting parameters such that when a predetermined setting condition including a set voltage value is given, a step-like transient voltage waveform having a plurality of transient steps adapted to the predetermined setting condition is formed; and a device power supply (DPS) configured to supply power to the plurality of devices under test formed on the substrate, wherein the voltage application device outputs, to the plurality of devices under test formed on the substrate, an output voltage having the step-like transient voltage waveform based on the transient voltage setting parameters set by the voltage setting controller, the voltage application device is a high-order lag system of a second-order or higher in which an overshoot occurs in a response obtained when an output voltage output from the device power supply is step-input to the devices under test connected to the voltage application device with respect to a set voltage, and an end point of a step time of each of the transient steps set in the voltage setting controller is set to be a time between an end point of a rising time and an overshoot time in a step response curve of the high-order lag system.

2. The voltage application device according to claim 1, further comprising: a digital-to-analog converter and an output circuit, wherein a signal including the transient power setting parameters set by the voltage setting controller is converted into an analog signal by the digital-to-analog convertor and then output as an output voltage via the output circuit.

3. The voltage application device according to claim 1, wherein the transient voltage waveform is formed such that a step voltage of a transient step decreases as the transient step proceeds.

4. The voltage application device according to claim 1, wherein in response to a plurality of setting conditions including a set voltage value, the voltage setting controller acquires, as the transient voltage setting parameters, the number of transient steps, step time, and step voltage adapted to the predetermined setting condition from a database in which a plurality of data on the number of transient steps, step time, and step voltage is stored.

5. The voltage application device according to claim 1, wherein the device power supply (DPS) is a parametric measurement unit (PMU), or a driver.

6. A method of forming an output voltage waveform using a voltage application device to test electrical characteristics of a plurality of devices under test formed on a substrate, the method comprising:

when a condition including a set voltage value is given, setting a number of transient steps, step time, and step voltage, as transient voltage setting parameters, such that a step-like transient voltage waveform having a plurality of transient steps adapted to the condition is formed; and forming an output voltage having the step-like transient voltage waveform based on the transient voltage setting parameters;

applying the output voltage having the step-like transient voltage waveform to the plurality of devices under test formed on the substrate using the voltage application device, wherein a response when the output voltage output from the voltage application device is step-input to the plurality of devices under test connected to the voltage application device is a high-order lag system of a second-order or higher in which an overshoot occurs with respect to the set voltage, and an end point of the step time of each of the transient steps is set to be a time between an end point of a rising time and an overshoot time in a step response curve of the high-order lag system to remove the overshoot from each transient step.

7. The method according to claim 6, wherein the transient voltage waveform is formed such that the step voltage of the transient step becomes smaller as the transient step proceeds.

8. The method according to claim 6, wherein in response to a plurality of setting conditions including the set voltage value, the number of transient steps, step time, and step voltage adapted to predetermined setting conditions are acquired as the transient voltage setting parameters from a database in which a plurality of data on the number of transient steps, step time, and step voltage is stored.

9. The method according to claim 6, wherein the rising time is a time required for the output voltage to reach 90% from 10% of the set voltage value.

10. The method according to claim 6, wherein the overshoot time is a time to a maximum overshoot value.

\* \* \* \* \*